(12) United States Patent
Han et al.

(10) Patent No.: US 11,317,047 B2
(45) Date of Patent: Apr. 26, 2022

(54) GRAY COUNTER AND IMAGE SENSOR INCLUDING THE SAME

(71) Applicant: SAMSUNG ELECTRONICS CO., LTD., Suwon-si (KR)

(72) Inventors: Younghun Han, Suwon-si (KR); Jaeha Eom, Seoul (KR); Seunghoon Jung, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/984,661

(22) Filed: Aug. 4, 2020

(65) Prior Publication Data

US 2021/0160450 A1 May 27, 2021

(30) Foreign Application Priority Data

Nov. 27, 2019 (KR) .................. 10-2019-0154707

(51) Int. Cl.
*H04N 5/378* (2011.01)
*H03K 23/00* (2006.01)
*H03K 23/54* (2006.01)
*H04N 5/3745* (2011.01)
*H03M 7/16* (2006.01)

(52) U.S. Cl.
CPC ....... *H04N 5/37455* (2013.01); *H03K 23/005* (2013.01); *H03K 23/542* (2013.01); *H03M 7/16* (2013.01); *H04N 5/378* (2013.01); *H04N 5/37452* (2013.01)

(58) Field of Classification Search
CPC .......... H04N 5/37452; H04N 5/37455; H04N 5/378; H03M 7/16; H03K 23/005; H03K 23/40; H03K 23/50; H03K 23/54; H03K 23/542
See application file for complete search history.

(56) References Cited

U.S. PATENT DOCUMENTS

| | | |
|---|---|---|
| 5,754,614 A | 5/1998 | Wingen |
| 6,433,725 B1 | 8/2002 | Chen et al. |
| 6,931,091 B2 | 8/2005 | Heimbigner |
| 7,991,104 B1 | 8/2011 | Dahan |
| 9,363,452 B2 | 6/2016 | Iwaki et al. |
| 2018/0241400 A1 | 8/2018 | Liu |
| 2019/0052827 A1 | 2/2019 | Koyama |
| 2020/0153440 A1* | 5/2020 | Sakurai .................. H04N 5/378 |

FOREIGN PATENT DOCUMENTS

KR      10-1152461 B1    6/2012

* cited by examiner

*Primary Examiner* — Daniel M Pasiewicz
(74) *Attorney, Agent, or Firm* — Lee IP Law, PC

(57) ABSTRACT

An image sensor includes a pixel sensor that senses an incident light and outputs a sampling signal of an analog shape, a sampler that compares the sampling signal and a ramp signal and outputs a comparison signal being time-axis length information, and a gray counter that counts a length of the comparison signal in synchronization with a clock signal and outputs a digital value. The gray counter includes a first flip-flop that divides the clock signal by 2 and generates a first gray code signal, a second flip-flop that delays a first data signal being a four-divided signal of the clock signal and outputs a second gray code signal, and a third flip-flop that delays the second gray code signal being two-divided and outputs a third gray code signal.

20 Claims, 13 Drawing Sheets

GRAY COUNTER AND IMAGE SENSOR INCLUDING THE SAME

CROSS-REFERENCE TO RELATED APPLICATION

Korean Patent Application No. 10-2019-0154707, filed on Nov. 27, 2019, in the Korean Intellectual Property Office, and entitled: "Gray Counter and Image Sensor Comprising the Same," is incorporated by reference herein in its entirety.

BACKGROUND

1. Field

Embodiments relate to a semiconductor device, and more particularly, relate to a gray code generator and an image sensor including the same.

2. Description of the Related Art

A counter is used to convert an effective physical quantity, such as the intensity of light, the intensity of sound, and a time, into a digital signal.

SUMMARY

Embodiments are directed to an image sensor, including: a pixel sensor configured to sense an incident light and to output an analog sampling signal; a sampler configured to compare the sampling signal and a ramp signal, and to output a comparison signal of time-axis length information; and a gray counter configured to count a length of the comparison signal in synchronization with a clock signal, and to output a digital value, the gray counter including: a first flip-flop configured to divide the clock signal by 2, and to generate a first gray code signal; a second flip-flop configured to delay a first data signal, which is a four-divided signal of the clock signal, and to output a second gray code signal; and a third flip-flop configured to delay the second gray code signal, which is two-divided, and to output a third gray code signal.

Embodiments are also directed to a gray counter that generates a gray code count value in synchronization with a clock signal, including: a first flip-flop configured to divide the clock signal by 2, and to generate a first gray code signal corresponding to a least significant bit gray count value; a Johnson counter configured to divide the clock signal by 4, and to output a first data signal; a second flip-flop configured to delay the first data signal as much as a length corresponding to one period of the clock signal, and to output a second gray code signal; a third flip-flop configured to divide the second gray code signal by 2, and to output a third gray code signal; and a plurality of flip-flops configured to generate a count value above the third gray code signal using the clock signal and the third gray code signal.

Embodiments are also directed to a gray counter that generates a gray code count value in synchronization with a clock signal, including: a replica circuit configured to generate a first gray code signal corresponding to a least significant bit gray count value from a first clock signal, which is obtained by dividing the clock signal by 2; a first flip-flop configured to delay a second clock signal, which is obtained by delaying the first clock signal as much as half a period of the clock signal, and to output a second gray code signal; a Johnson counter triggered at the second clock signal, and configured to divide and output the second clock signal by 2; a second flip-flop configured to delay an output of the Johnson counter as much as one period of the second clock signal, and to output a third gray code signal; a third flip-flop configured to divide the third gray code signal by 2, and to output a fourth gray code signal; and a plurality of flip-flops configured to generate a count value above the fourth gray code signal using the fourth gray code signal.

BRIEF DESCRIPTION OF THE DRAWINGS

Features will become apparent to those of skill in the art by describing in detail example embodiments with reference to the attached drawings in which.

DETAILED DESCRIPTION

Figure 1:
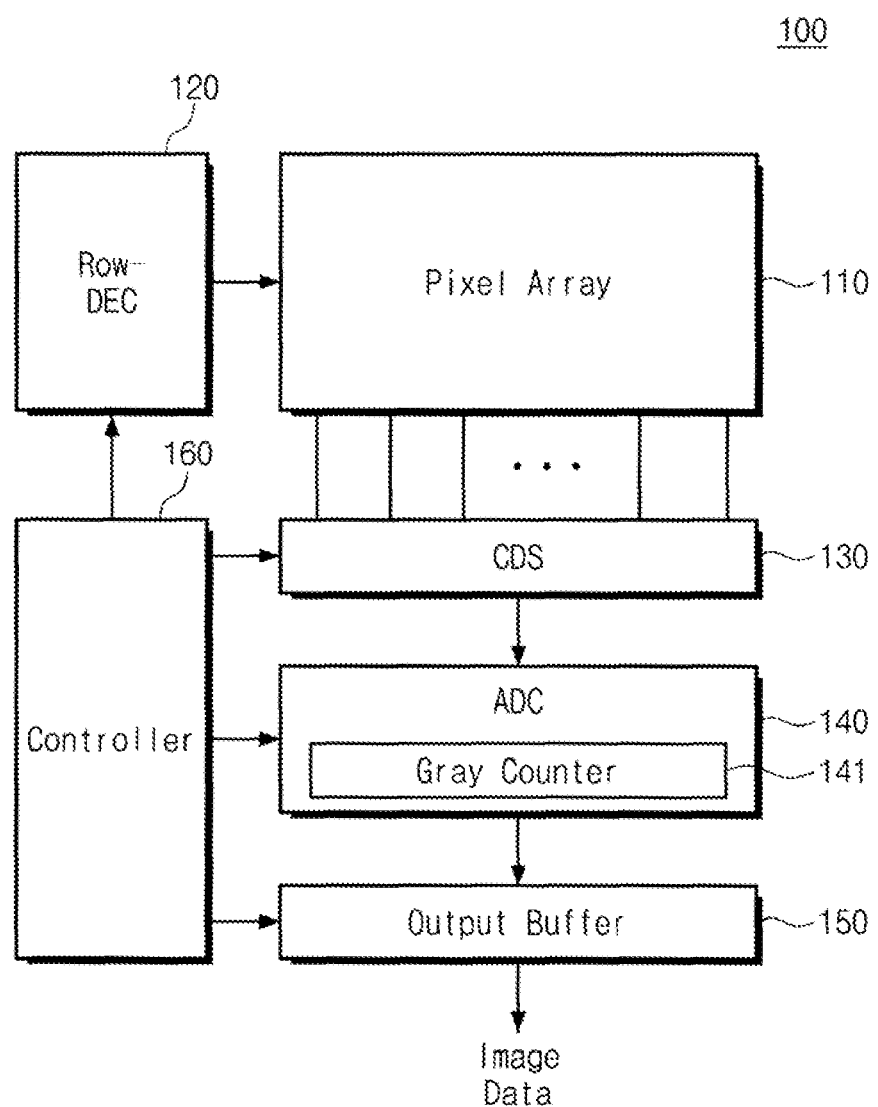
FIG. 1 is a block diagram illustrating an image sensor according to an example embodiment.

FIG. 1 is a block diagram illustrating an image sensor according to an example embodiment.

Referring to FIG. 1, an image sensor 100 according to an example embodiment may include a pixel sensor array 110, a row decoder 120, a correlated double sampler (CDS) 130, an analog-to-digital converter (ADC) 140, an output buffer 150, and a controller 160.

The pixel sensor array 110 may include a plurality of pixel sensors arranged two-dimensionally, each of the pixel sensors converting a light signal into an electrical signal. The pixel sensor array 110 may be driven by driving signals provided from the row decoder 120, such as a selection signal SEL, a reset signal RS, and a transfer signal TG. Electrical signals generated from the respective pixel sensors in response to the driving signals may be provided to the correlated double sampler 130 through a plurality of column lines CL0, CL1 . . . CLm-1. One pixel sensor may include a single photoelectric conversion element (e.g., a photodiode).

The row decoder 120 may select a row of the pixel sensor array 110 under control of the controller 160. The row decoder 120 may generate the selection signal SEL for the purpose of selecting one of the plurality of rows. The row decoder 120 may sequentially activate the reset signal RS and the transfer signal TG with respect to pixel sensors corresponding to the selected row. In this case, a reset signal RESET and an image signal SIG that are generated from each of the active pixel sensors of the selected row in an analog shape may be sequentially transferred to the correlated double sampler 130.

The correlated double sampler 130 may sequentially sample and hold a set of the reset signal RESET and the image signal SIG provided from the pixel sensor array 110 to each of the plurality of column lines CL0, CL1 . . . CLm-1. Thus, the correlated double sampler 130 may sample and hold a level of the reset signal RESET and the image signal SIG corresponding to each of the columns. Under control of the controller 160, the correlated double sampler 130 may transfer the sampled reset signal RESET and the sampled image signal SIG of each of the columns to the analog-to-digital converter 140 in units of a plurality of columns.

The analog-to-digital converter 140 may convert a sampling signal of each column output from the correlated double sampler 130 into a digital signal. The analog-to-digital converter 140 may convert a sampling signal into a digital signal by using a hybrid counter. Thus, the analog-to-digital converter 140 may count the reset signal RESET and the image signal SIG using a ripple counter (not illustrated) and a gray counter 141. For example, the gray counter 141 may remove a delay due to exclusive OR (XOR) logic gate or NOR logic gate. Further, the gray counter 141 may remove a differential non-linearity (DNL) due to a replica replicating a flip-flop. Additional details are set forth below with reference to the drawings.

The output buffer 150 may latch and output image data provided from the analog-to-digital converter 140 in units of a column. Under control of the controller 160, the output buffer 150 may temporarily store image data output from the analog-to-digital converter 140 and may then output the sequentially latched image data. The output buffer 150 may be included in the image sensor 100 or may be omitted.

The controller 160 may control the pixel sensor array 110, the row decoder 120, the correlated double sampler 130, the analog-to-digital converter 140, and the output buffer 150. The controller 160 may supply control signals (e.g., a clock signal and a timing control signal) that are used for operations of the pixel sensor array 110, the row decoder 120, the correlated double sampler 130, the analog-to-digital converter 140, and the output buffer 150. The controller 160 may include a logic control circuit, a phase locked loop (PLL) circuit, a timing control circuit, a communication interface circuit, etc.

The analog-to-digital converter 140 may include the gray counter 141 that is used to count lower bits. The gray counter 141 may be implemented with only a flip-flop, thus removing a delay or the differential non-linearity (DNL) due to a replica or logics (e.g., XOR gate or NOR gate). The gray counter 141 may be used in a high-speed image sensor and may allow for an increase in a frequency of a clock signal.

Figure 2:
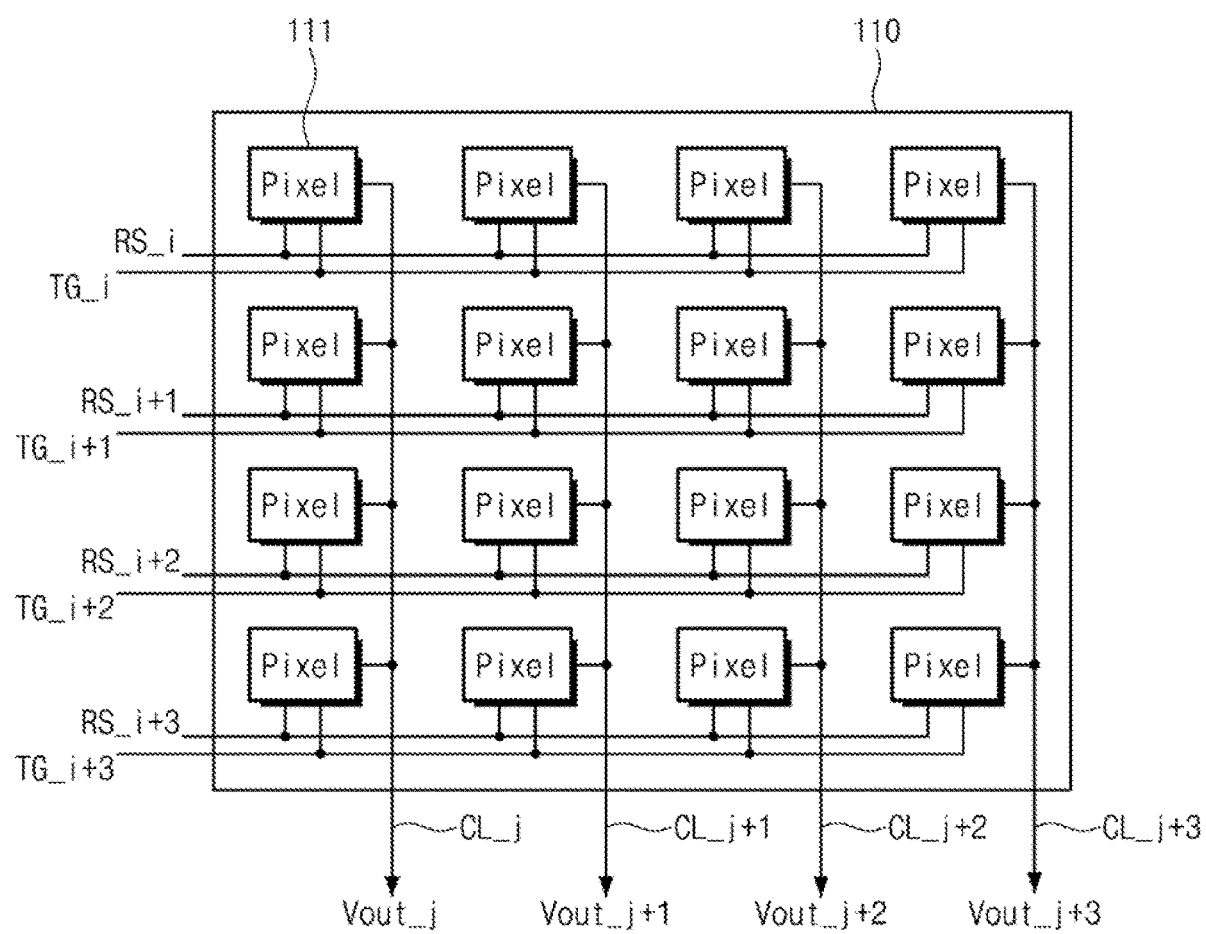
FIG. 2 is a block diagram illustrating a pixel sensor array.

FIG. 2 is a block diagram illustrating a pixel sensor array.

Referring to FIG. 2, the pixel sensor array 110 may include pixel sensors 111 arranged in a matrix of a plurality of rows and a plurality of columns.

Each of the pixel sensors 111 of the pixel sensor array 110 may include at least one of a red filter, a green filter, and a blue filter. The red filter transmits a light in a red wavelength band, the green filter transmits a light in a green wavelength band, and the blue filter transmits a light in a blue wavelength band. In addition, the pixel sensor 111 may include a plurality of transistors and a photoelectric conversion element. Each of the plurality of pixel sensors 111 may sense a light by using the photoelectric conversion element, convert the sensed light into an electrical signal, and output the electrical signal through a column line CL. In addition, to apply a reset multiple sampling technique, the pixel sensor 111 may be implemented to have a structure including at least two photoelectric conversion elements.

When a reset signal RS_i and a transfer signal TG_i are provided to a selected row "i" of the pixel sensor array 110, sampling signals Vout_j, Vout_j+1, Vout_j+1, Vout_j+2, and Vout_j+3 corresponding to each of the reset signal RS_i and the transfer signal TG_i may be output to column lines CL_j, CL_j+1, CL_j+2, and CL_j+3 of the selected row "i". The sampling signals Vout_j, Vout_j+1, Vout_j+2, and Vout_j+3 may be provided to the correlated double sampler 130 so as to be sampled as the reset signal RESET and the image signal SIG.

Figure 3:
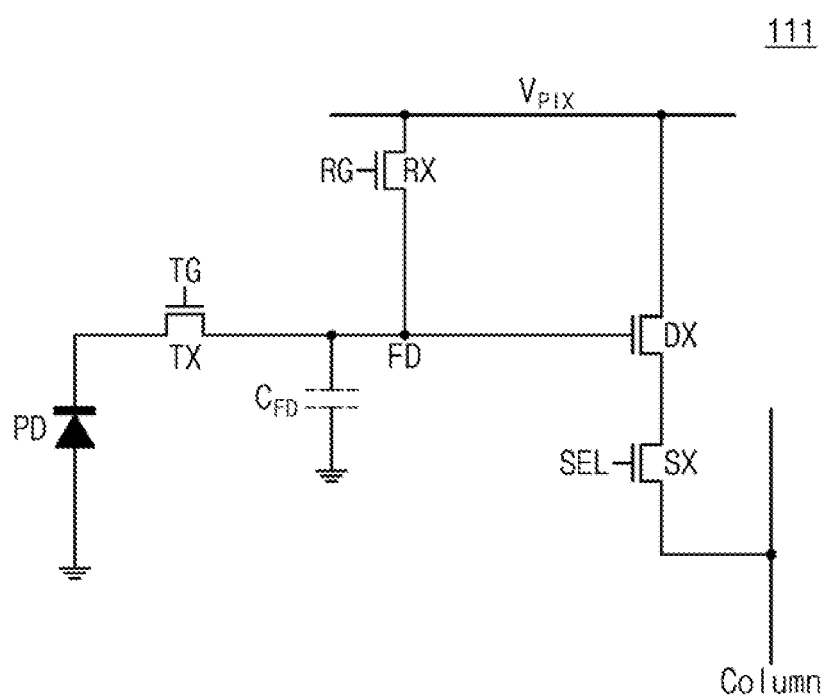
FIG. 3 is a circuit diagram illustrating an example configuration of one pixel sensor illustrated in FIG. 2.

FIG. 3 is a circuit diagram illustrating an example configuration of one pixel sensor illustrated in FIG. 2.

Referring to FIG. 3, the pixel sensor 111 may be implemented to have a structure including one photoelectric conversion element PD and four NMOS transistors TX, RX, DX, and SX. The pixel sensor 111 may also include a transistor or a capacitor for various functions.

The photoelectric conversion element PD may be a light sensing element for generating and accumulating charges based on the amount of incident light or the intensity of light. The photoelectric conversion element PD may be implemented with, e.g., a photo diode, a photo transistor, a photo gate, or a pinned photo diode (PPD).

A transfer transistor TX may transfer charges accumulated at the photoelectric conversion element PD to a floating diffusion area FD. The transfer transistor TX may be implemented with one transistor that is turned on or off in response to the transfer signal TG provided from the row decoder 120.

The floating diffusion area FD may accumulate charges corresponding to the amount of incident light. The floating diffusion area FD may accumulate charges provided from the photoelectric conversion element PD while the transfer signal TG is activated. To accumulate charges, the floating diffusion area FD may have a capacitance CFD of a given magnitude. The floating diffusion area FD may be connected with a gate terminal of a drive transistor DX operating as a source follower amplifier. The floating diffusion area FD may be provided with a power supply voltage VDD by a reset transistor RX.

The reset transistor RX may reset the floating diffusion area FD in response to the reset signal RS on signal line RG. A source of the reset transistor RX may be connected to the floating diffusion area FD, and a drain thereof is connected to a power supply voltage (VDD) terminal. When the reset transistor RX is turned on by a bias voltage of the reset signal RS, the power supply voltage VDD connected with the drain of the reset transistor RX may be transferred to the floating diffusion area FD such that the charges accumulated at the floating diffusion area FD move to the power supply voltage (VDD) terminal, and a voltage of the floating diffusion area FD is reset.

The drive transistor DX may operate as a source follower amplifier, amplify the change in an electrical potential of the floating diffusion area FD, and output a result of the amplification as the sense voltage Vout_j.

The selection transistor SX may select a pixel sensor to be read in units of a row. The selection transistor SX may be driven by the selection signal SEL provided in units of a row.

When the selection transistor SX is turned on, the potential of the floating diffusion area FD may be amplified through the drive transistor DX and may then be transferred to a drain of the selection transistor SX. Respective driving signal lines TG, RG, and SEL of the transfer transistor TX, the reset transistor RX, and the selection transistor SX may be extended in a row direction (e.g., a horizontal direction) such that unit pixel sensors included in the same row are simultaneously driven.

Figure 4:
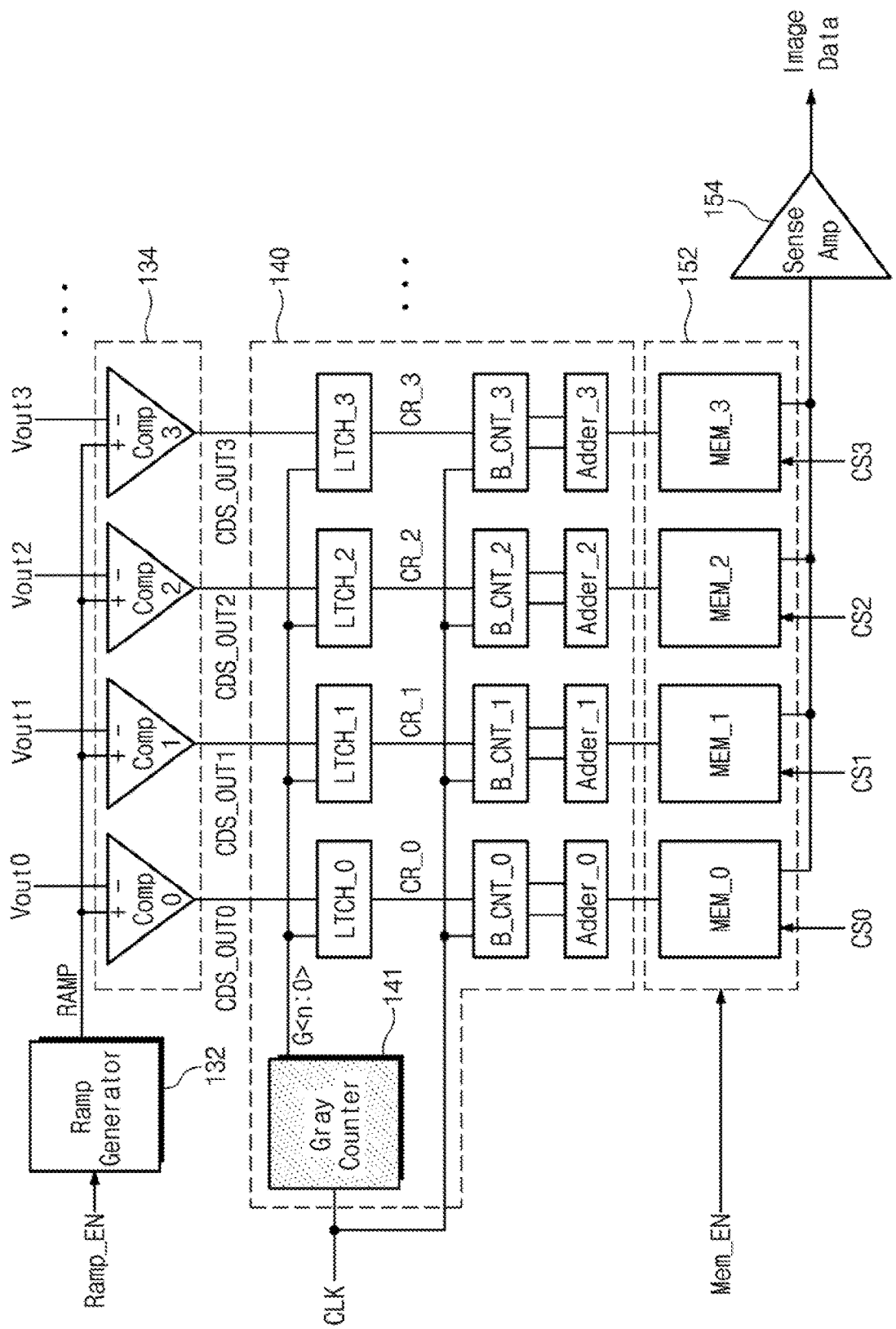
FIG. 4 is a block diagram illustrating an example structure of a correlated double sampler, an analog-to-digital converter, and an output buffer of FIG. 1.

FIG. 4 is a block diagram illustrating an example structure of a correlated double sampler, an analog-to-digital converter, and an output buffer of FIG. 1.

Referring to FIG. 4, the correlated double sampler 130 may include a ramp signal generator 132 and a comparator 134. The analog-to-digital converter 140 may include at least one gray counter 141. The output buffer 150 may include memories MEM_0, MEM_1, MEM_2, and MEM_3 and a sense amplifier 154. The output buffer 150 may be included in the image sensor 100 or may be omitted.

The ramp signal generator 132 of the correlated double sampler 130 may output a ramp signal RAMP having a uniform falling or rising slope in response to a control signal Ramp_EN from the controller 160. Thus, the ramp signal generator 132 may continuously generate the ramp signal RAMP having a specific slope under control of the controller 160. Through a comparison with the ramp signal RAMP, each of the reset signal RESET and the image signal SIG may be converted into time-axis length information.

The comparator 134 may include a plurality of comparators Comp0, Comp1, Comp2, and Comp3 provided for respective columns of the pixel sensor array 110 to compare each of sampling signals Vout0, Vout1, Vout2, and Vout3 respectively corresponding to columns with the ramp signal RAMP. Each of the sampling signals Vout0, Vout1, Vout2, and Vout3 may include the reset signal RESET and the image signal SIG that are sampled and held by a correlated double sampling operation.

An operation in which the first comparator Comp0 compares the sampling signal Vout0 and the ramp signal RAMP may be implemented as follows. The ramp signal RAMP may be input to a non-inverting input terminal (+) of the first comparator Comp0, and the sampling signal Vout0 may be input to a inverting input terminal (−) of the first comparator Comp0. The first comparator Comp0 may output a CDS output signal CDS_OUT0 by comparing the ramp signal RAMP and the reset signal RESET of the sampling signal Vout0 in a first period and comparing the ramp signal RAMP and the image signal SIG of the sampling signal Vout0 in a second period. Through this procedure, the reset signal RESET and the image signal SIG including level information may be converted into time-axis length information. Operating characteristics of the second, third, and fourth comparators Comp1, Comp2, and Comp3 are substantially identical to that of the first comparator Comp0 except that columns corresponding to the comparators Comp0 to Comp3 are different, and thus, additional description will be omitted to avoid redundancy.

The analog-to-digital converter 140 may include the gray counter 141, a plurality of latches LTCH_0, LTCH_1, LTCH_2, and LTCH_3, a plurality of binary counters B_CNT_0, B_CNT_1, B_CNT_2, and B_CNT_3, and a plurality of adders Adder_0, Adder_1, Adder_2, and Adder_3.

The gray counter 141 may generate a gray code GC based on a clock signal CLK provided from the controller 160, where the gray code GC is a count signal that is counted up or counted down in a gray code manner. The gray counter 141 may be implemented by using a flip-flop FF without a logic gate or logic circuit (e.g., XOR or NOR) or a replica circuit. Accordingly, a delay due to the logic gate or circuit (e.g., XOR or NOR) and degradation of the differential non-linearity (DNL) due to a replica circuit may be avoided.

The plurality of latches LTCH_0, LTCH_1, LTCH_2, and LTCH_3 may latch the counted lower bits of the CDS output signals CDS_OUT0 to CDS_OUT3 based on the gray code GC. In addition, the plurality of latches LTCH_0, LTCH_1, LTCH_2, and LTCH_3 may transfer the most significant bits CR_0, CR_1, CR_2, and CR_3 of the counted gray code GC to the binary counters B_CNT_0, B_CNT_1, B_CNT_2, and B_CNT_3 of corresponding columns. In general, the most significant bit of the gray code GC has the same bit value as a least significant bit of a binary code. Accordingly, the plurality of binary counters B_CNT_0, B_CNT_1, B_CNT_2, and B_CNT_3 may count the CDS output signals CDS_OUT0 to CDS_OUT3 so as to be counted from the transferred most significant bits CR_0, CR_1, CR_2, and CR_3. The plurality of adders Adder_0, Adder_1, Adder_2, and Adder_3 may convert the gray code GC stored in the plurality of latches LTCH_0, LTCH_1, LTCH_2, and LTCH_3 into a binary value, may add the binary value and a value counted by the plurality of binary counters B_CNT_0, B_CNT_1, B_CNT_2, and B_CNT_3, and may output the added result as an image data value of the CDS output signals CDS_OUTj (j=0, 1, 2, and 3).

The output buffer 150 may include a column memory 152 and the sense amplifier 154. The column memory 152 may store image data corresponding to respective columns in response to a control signal Mem_EN from the controller 160. The column memory 152 may include the plurality of memories MEM_0, MEM_1, MEM_2, and MEM_3, which sequentially transfer the stored image data to the sense amplifier 154. The output buffer 150 may be included in the image sensor 100 (refer to FIG. 1) or may be omitted.

In the analog-to-digital converter 140 described above, the use of the gray counter 141 may avoid delay due to a logic circuit (e.g., XOR or NOR) and may avoid the differential non-linearity (DNL) due to a replica circuit.

Figure 5:
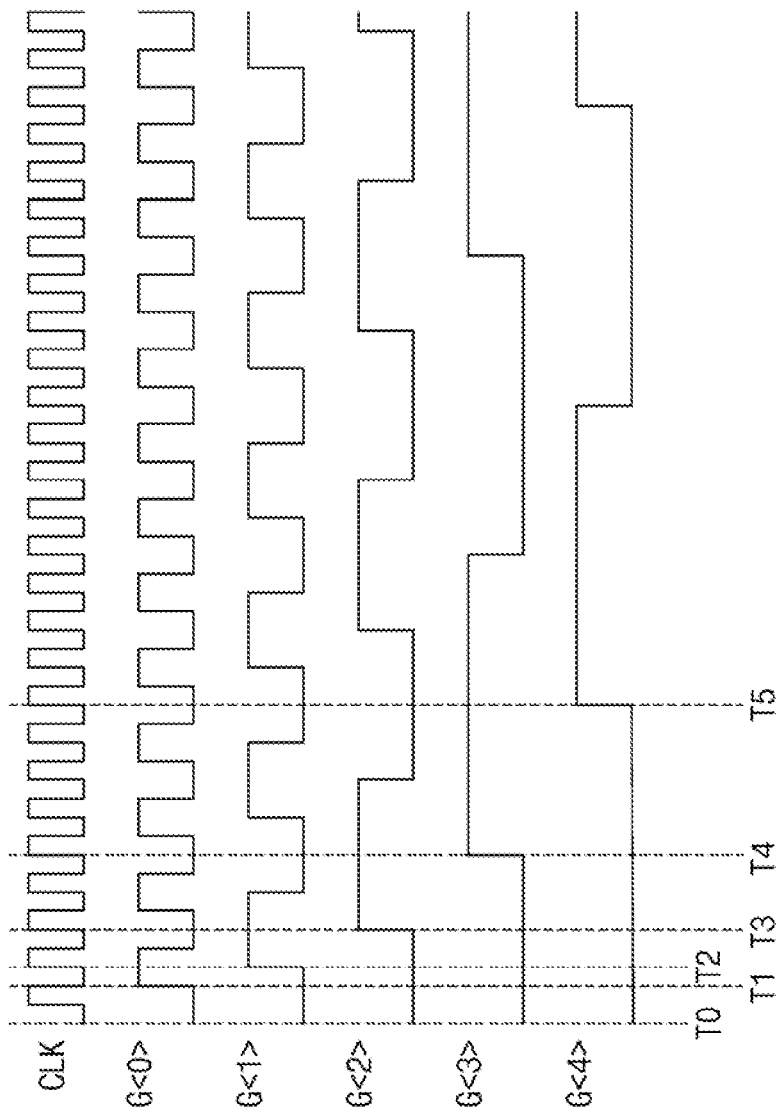
FIG. 5 is a timing diagram illustrating a gray code according to an example embodiment.

FIG. 5 is a timing diagram illustrating a gray code GC according to an example embodiment.

Referring to FIG. 5, the gray counter 141 of FIG. 4 may generate gray code signals G<0> to G<4> of five lower bits in synchronization with the clock signal CLK. Here, it is assumed that an initial state of the gray counter 141 is "00000". Accordingly, at a time T0, logical values of all the gray code signals G<0> to G<4> start from logic "0". The clock signal CLK may be a signal obtained by dividing a system clock of the image sensor 100 (refer to FIG. 1) by 2, for example.

In the present example embodiment, the gray code signal G<0> corresponding to the LSB value is generated as a clock signal that transitions in synchronization with a falling edge of the clock signal CLK. The gray code signal G<0> is generated as a signal having a frequency that is one-half the frequency of the clock signal CLK. At a time T1 at which the first falling edge of the clock signal CLK is generated, the gray code signal G<0> transitions from logic "0" to logic "1". Afterwards, the gray code signal G<0> having a logical value that is inverted every falling edge of the clock signal CLK may be generated.

The gray code signal G<1> may have a frequency corresponding to half the frequency of the gray code signal G<0>. The gray code signal G<1> may start to transition at a time that is delayed with respect to the time T1 corresponding to the first transition time of the LSB gray code signal G<0>, as much as half a period of the clock signal CLK. Accordingly, the gray code signal G<1> transitions from logic "0" to logic "1" at a time T2 at which the second rising edge of the clock signal CLK is generated. Afterwards, the gray code signal G<1> may be generated as a signal that is toggled in synchronization with (or at) a rising edge of the clock signal CLK within a high period (e.g., logic "1") of the gray code signal G<0>.

The gray code signal G<2> may have a frequency corresponding to half the frequency of the gray code signal G<1>. The gray code signal G<2> may start to transition at a time that is delayed with respect to the time T2 corresponding to the first transition time of the gray code signal G<1>, as much as one period of the clock signal CLK. Accordingly, the gray code signal G<2> transitions from logic "0" to logic "1" at a time T3 at which the third rising edge of the clock signal CLK is generated. Afterwards, the gray code signal G<2> may be generated as a signal that is toggled in synchronization with (or at) a rising edge of the clock signal CLK within a high period (e.g., logic "1") of the gray code signal G<1>.

The gray code signal G<3> may have a frequency corresponding to half the frequency of the gray code signal G<2>. The gray code signal G<3> may start to transition at a time that is delayed with respect to the time T3 corresponding to the first transition time of the gray code signal G<2>, as much as two periods (2CLK) of the clock signal CLK. Accordingly, the gray code signal G<3> transitions from logic "0" to logic "1" at a time T4 at which a rising edge of the clock signal CLK is generated. Afterwards, the gray code signal G<3x may be generated as a signal that is toggled in synchronization with (or at) a rising edge of the clock signal CLK within a high period (e.g., logic "1") of the gray code signal G<2>.

The gray code signal G<4> may have the same frequency as the gray code signal G<3>. The gray code signal G<4> may start to transition at a time that is delayed with respect to the time T4 corresponding to the first transition time of the gray code signal G<3>, as much as four periods (4CLK) of the clock signal CLK. Accordingly, the gray code signal G<4> transitions from logic "0" to logic "1" at a time T5 at which a rising edge of the clock signal CLK is generated.

Thus, as described above, waveforms for a 5-bit gray code G[4:0] may be generated by the gray counter 141 of FIG. 4.

Figure 6:
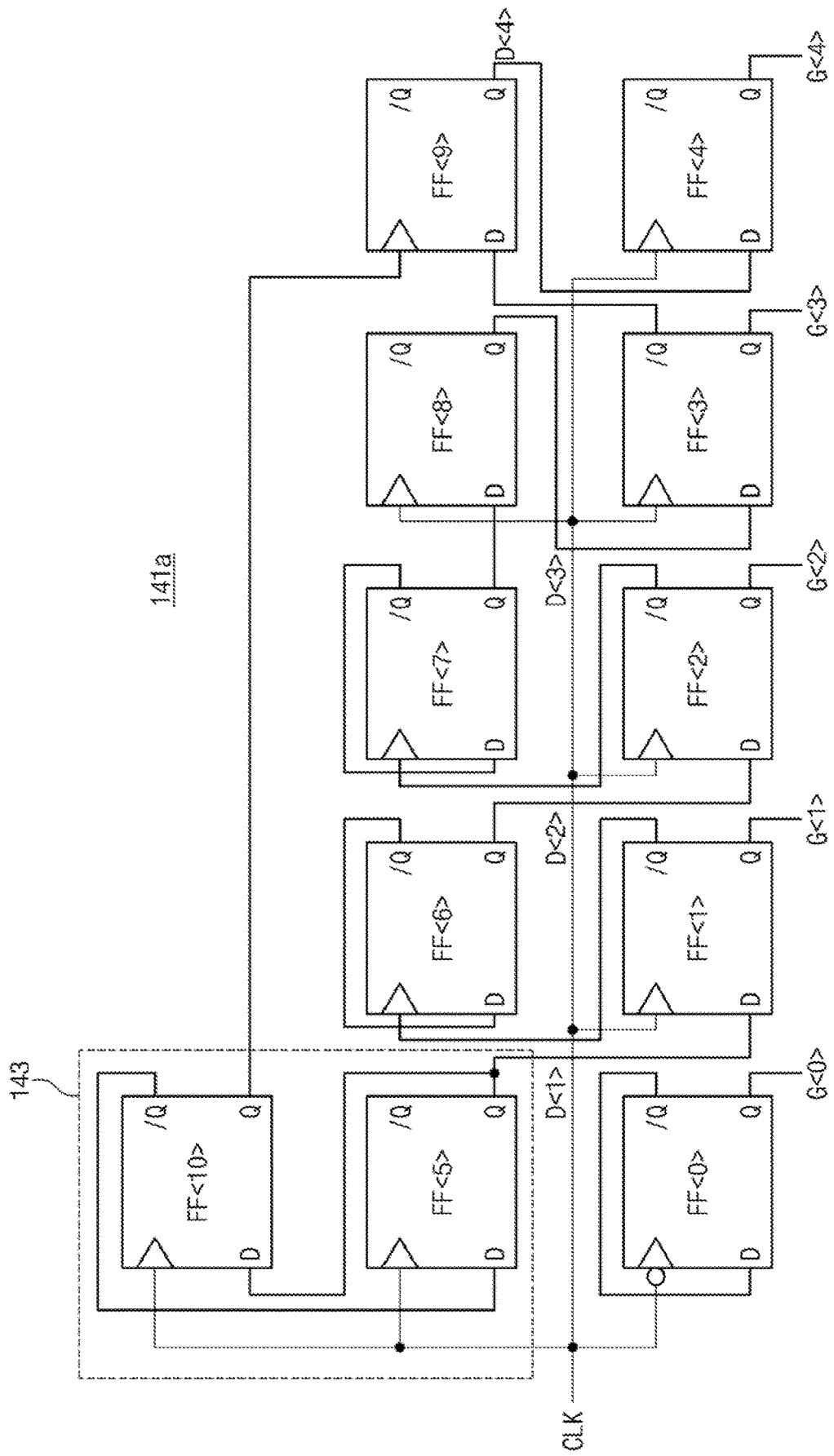
FIG. 6 is a diagram illustrating an embodiment of a gray counter of FIG. 4.

FIG. 6 is a diagram illustrating an example embodiment of a gray counter of FIG. 4.

Referring to FIG. 6, a gray counter 141a according to an example embodiment may generate the 5-bit gray code G[4:0] (or the five gray code signals G<0> to G<4>) by using only 11 flip-flops FF<0> to FF<10> without a logical operation for outputs of flip-flops or a clock signal.

First, the flip-flop FF<0> may be used to generate the gray code signal G<0> corresponding to the least significant bit. To generate the gray code signal G<0>, an inverted output terminal /Q of the flip-flop FF<0> is connected with a data input terminal "D". The clock signal CLK is inverted and input to a clock input terminal. The flip-flop FF<0> may toggle output terminals Q and /Q in synchronization with the inverted version of the clock signal CLK. Depending on this setting, the flip-flop FF<0> may output the LSB gray code signal G<0> that is toggled in synchronization with a falling edge of the clock signal CLK. Thus, because the LSB gray code signal G<0> is toggled at the falling edge of the clock signal CLK, the LSB gray code signal G<0> may start to transition to logic "1" after half a period of the clock signal CLK. The LSB gray code signal G<0> may have a frequency corresponding to half the frequency of the clock signal CLK.

The flip-flops FF<1>, FF<5>, and FF<10> are used to generate the gray code signal G<1>. The gray code signal G<1> may have half a period of the LSB gray code signal G<0> and may rise at a time that is delayed with respect to the first rising edge of the gray code signal G<0> as much as half a period (½CLK). Thus, the gray code signal G<1> may be generated by delaying first input data D<1> having a quarter frequency of the clock signal CLK as much as one period. The first input data D<1> are generated through a Johnson counter 143 that divides a clock signal by 4 (i.e., divides (and thus reduces) the frequency of the clock signal by a factor of 4), and operates in synchronization with a rising edge of the clock signal. The Johnson counter 143 is implemented by using the two flip-flops FF<5> and FF<10>.

The gray code signal G<1> of a previous bit is used to generate the gray code signal G<2>. The two flip-flops FF<2> and FF<6> that process the gray code signal G<1> are used to generate the gray code signal G<2>. An inverted version of the gray code signal G<1> output from the flip-flop FF<1> is provided to a clock input terminal of the flip-flop FF<6>. An inverted output terminal /Q of the flip-flop FF<6> is connected with a data input terminal "D" of the flip-flop FF<6> for the purpose of feeding back an output of the flip-flop FF<6>. Accordingly, the flip-flop FF<6> operates as a T-flip-flop that divides the inverted version of the gray code signal G<1> by 2 and outputs second input data D<2>. The flip-flop FF<2> delays the second input data D<2> as much as one period of the clock signal CLK and outputs the gray code signal G<2>. The above operation will be described in further detail below with reference to drawings.

The gray code signal G<2> of a previous bit is used to generate the gray code signal G<3>. The flip-flops FF<3>, FF<7>, and FF<8> are used to generate the gray code signal G<3>. An inverted version of the gray code signal G<2> output from the flip-flop FF<2> is provided to a clock input terminal of the flip-flop FF<7>. An inverted output terminal /Q of the flip-flop FF<7> is connected with a data input terminal "D" of the flip-flop FF<6> for the purpose of feeding back an output of the flip-flop FF<7>. Accordingly, the flip-flop FF<7> divides and outputs the inverted version of the gray code signal G<2> by 2. In this case, output data of the flip-flop FF<7> is delayed by the flip-flop FF<8> and FF<3> as much as two periods (2CLK) of the clock signal CLK. Thus, the third input data D<3> has a waveform that is obtained by delaying the inverted version of the gray code signal G<2> as much as one period of the clock signal CLK. The gray code signal G<3> is generated through an additional delay of the flip-flop FF<3>, which corresponds to one period of the clock signal CLK.

The gray code signal G<3> of a previous bit is used to generate the gray code signal G<4>. The flip-flops FF<4>, FF<9>, and FF<10> are used to generate the gray code signal G<4>. An inverted version of the gray code signal G<3> output from the flip-flop FF<3> is provided to a data input terminal "D" of the flip-flop FF<9>, and an output of the flip-flop FF<10> is provided to a clock input terminal of the flip-flop FF<9>. The flip-flop FF<4> delays fourth input data D<4> being an output of the flip-flop FF<9> as much as one period of the clock signal CLK and outputs the MSB gray code signal G<4>. For example, the output of the flip-flop FF<10>, which is provided to the clock input terminal of the flip-flop FF<9>, corresponds to the output of the Johnson counter 143.

As described above, the gray counter 141a may be implemented with only the flip-flops FF<0> to FF<10>. In the case of the gray counter 141a, only a delay corresponding to two flip-flops occurs at a critical path causing the greatest delay of a clock signal. For example, to generate the gray code signal G<2>, a clock-data delay Tc–q (clock to data delay) may occur at two flip-flops FF<1> and FF<6>, and a setup delay Tsetup may occur at the flip-flop FF<2>. A length of the magnitude of the delay occurring at the critical path is shorter than one period 1CLK that becomes a reference of a bottleneck of a high speed. Thus, the magnitude "2Tc–q+Tsetup" of the delay occurring at the critical path satisfies Equation 1 below.

$$2Tc{-}q+Tsetup<1CLK \qquad \text{[Equation 1]}$$

Accordingly, even if a speed of the gray counter 141a is increased and an operating voltage is unstable, a stable operation is possible. In addition, because a replica circuit is not used, the differential non-linearity DNL due to the use of a flip-flop and a replica circuit do not occur.

Figure 7A:
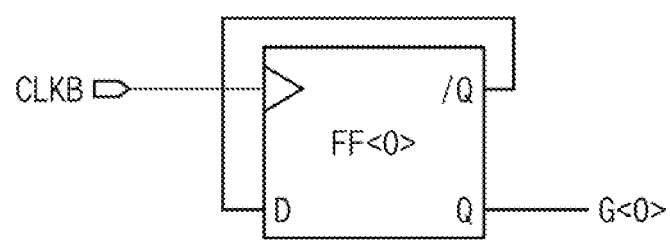
FIGS. 7A and 7B are diagrams illustrating a flip-flop generating an LSB gray code signal in a gray counter and an operation of the flip-flop.
Figure 7B:
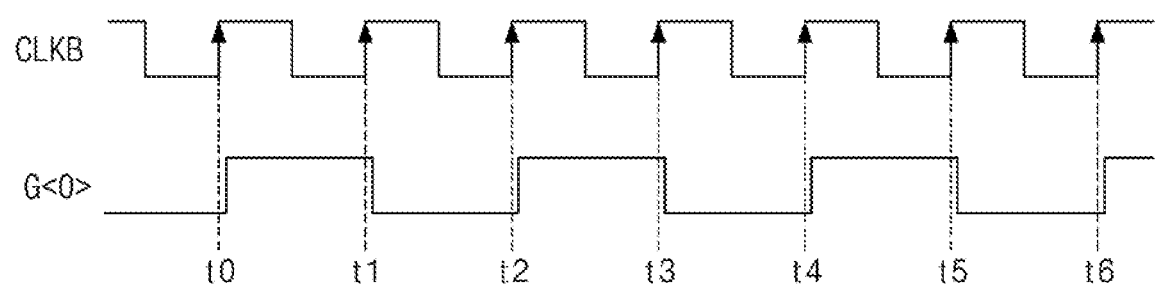

FIGS. 7A and 7B are diagrams illustrating a flip-flop generating the LSB gray code signal G<0> in a gray counter and an operation of the flip-flop.

FIG. 7A illustrates a circuit diagram of the flip-flop FF<0> that divides a clock signal CLKB by 2 and generates the gray code signal G<0>. FIG. 7B illustrates a waveform of the gray code signal G<0> being an output signal that the flip-flop FF<0> of FIG. 7A outputs in response to the clock signal CLK.

Referring to FIGS. 7A and 7B, the flip-flop FF<0> operates as a toggle flip-flop that divides an inverted clock signal CLKB by 2 and outputs the gray code signal G<0>. Thus, as the inverted data output terminal /Q of the flip-flop FF<0> is connected with the data input terminal "D" of the flip-flop FF<0>, the flip-flop FF<0> functions as a circuit that divides and outputs the inverted clock signal CLKB by 2. Accordingly, the gray code signal G<0> may repeatedly transition in synchronization with a rising edge of the inverted clock signal CLKB.

In further detail, referring to FIG. 7B, at a time t0 corresponding to the first rising edge of the inverted clock signal CLKB, the first rising edge of the gray code signal G<0> (which is generated by dividing the inverted clock signal CLKB by 2) occurs. At a time t1 corresponding to the second rising edge of the inverted clock signal CLKB, the first falling edge of the gray code signal G<0> occurs. Thus, as shown in the waveform diagram illustrated in FIG. 7B, the gray code signal G<0> may be respectively toggled at times t2, t3, t4, t5, and t6 corresponding to rising edges of the inverted clock signal CLKB.

Figure 8A:
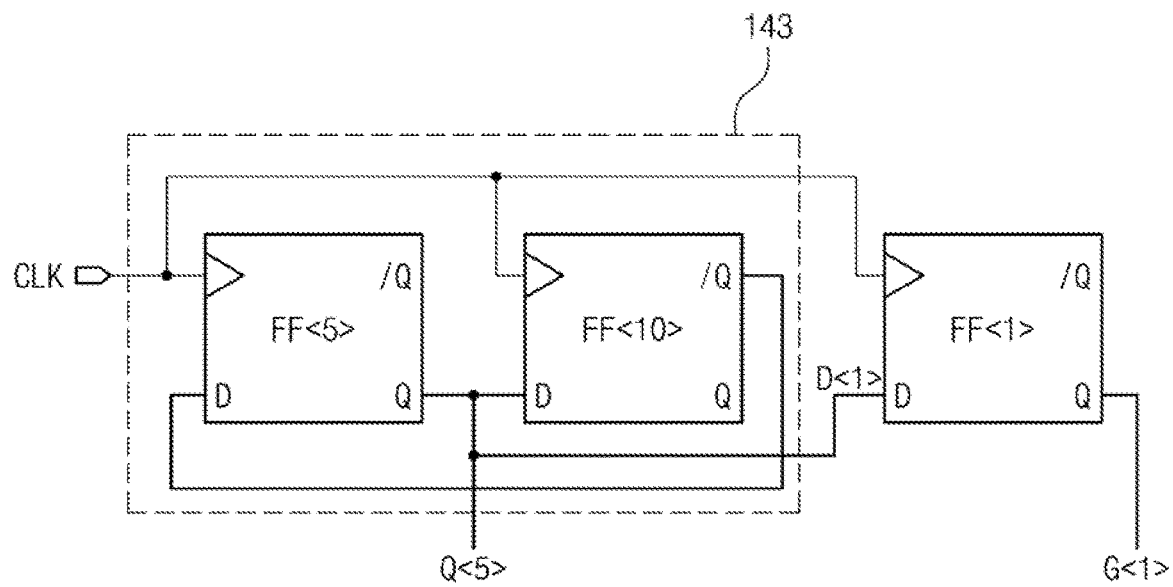
FIGS. 8A and 8B are diagrams illustrating flip-flops generating a gray code signal in a gray counter and an operation of the flip-flops.
Figure 8B:
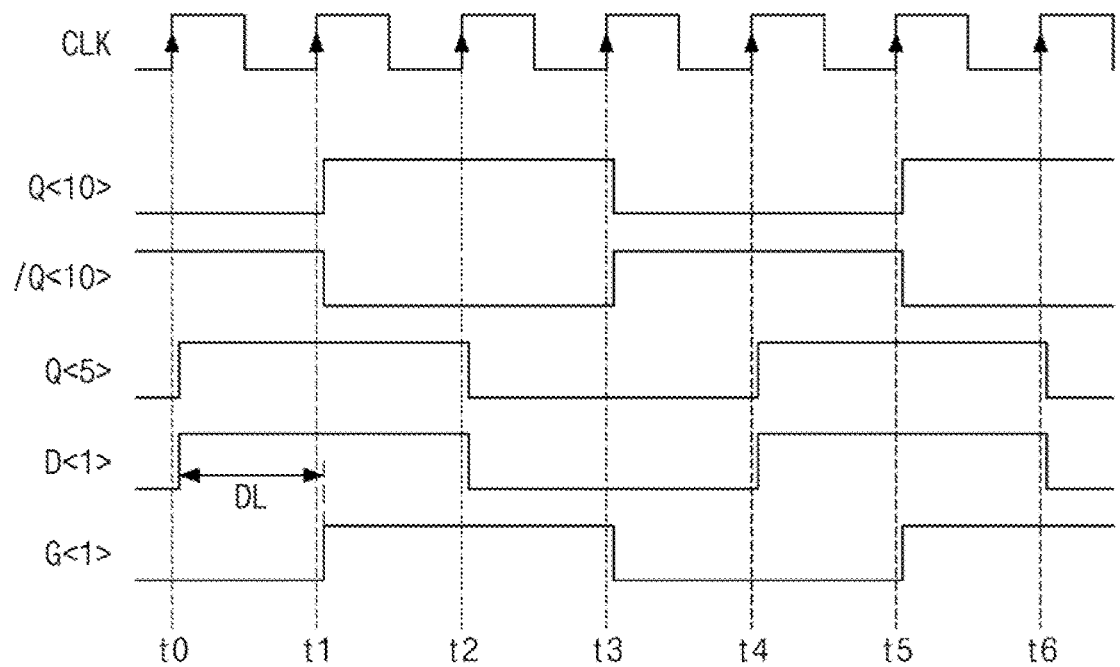

FIGS. 8A and 8B are diagrams illustrating flip-flops generating the gray code signal G<1> in a gray counter and an operation of the flip-flops.

FIG. 8A illustrates a circuit diagram of the flip-flops FF<1>, FF<5>, and FF<10> that divide the clock signal CLK by 4, delay the divided result as much as one period, and generate the gray code signal G<1>. FIG. 8B illustrates a waveform of the gray code signal G<1> generated by the flip-flops FF<1>, FF<5>, and FF<10> of FIG. 8A.

Referring to FIGS. 8A and 8B, the gray code signal G<1> may have a frequency corresponding to half the frequency of the gray code signal G<0>. Accordingly, the frequency of the gray code signal G<1> may be obtained by dividing the clock signal CLK by 4. The flip-flops FF<5> and FF<10> connected as the Johnson counter 143 may be used to divide the clock signal CLK by 4. The clock signal CLK is input to the clock input terminals of the flip-flops FF<5> and FF<10>. An output Q<5> of the flip-flop FF<5> is provided to the data input terminal "D" of each of the flip-flop FF<10> and the flip-flop FF<1>. The inverted output terminal /Q of the flip-flop FF<5> is connected with the data input terminal "D" of the flip-flop FF<5>. The first input data D<1> (=Q<5>) corresponding to an output of the Johnson counter 143 may be delayed by the flip-flop FF<1> as much as one period DL (=1CLK) of the clock signal CLK and may be output as the gray code signal G<1>. The Johnson counter 143 is used to divide the clock signal CLK by 4, but the clock signal CLK may be divided by 4 through various division circuits composed of flip-flops although consideration should. then be given to a delay of a specific value or greater occurring at a critical path.

Figure 9A:
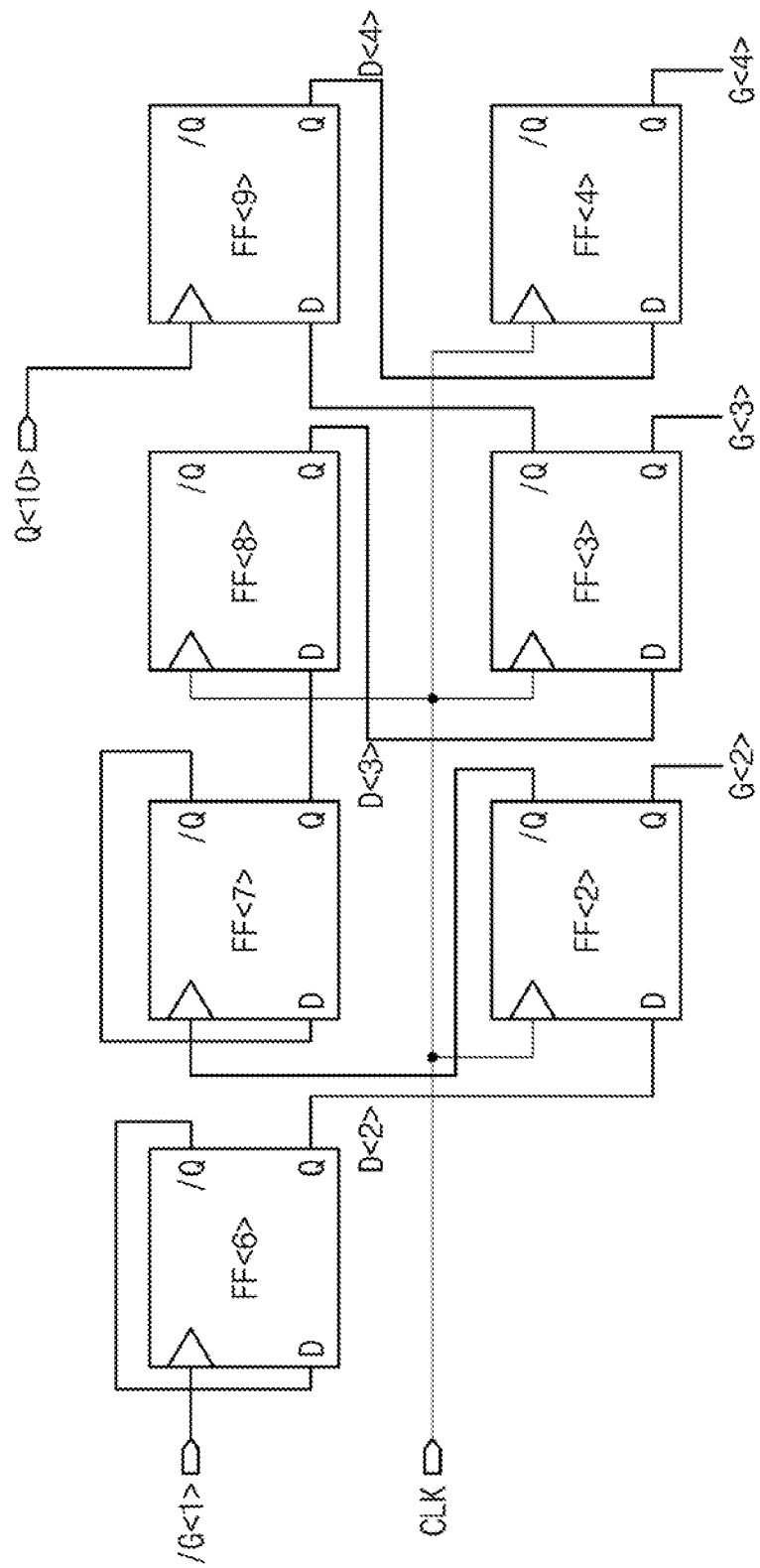
FIGS. 9A and 9B are diagrams illustrating flip-flops generating gray code signals in a gray counter and an operation of the flip-flops.
Figure 9B:
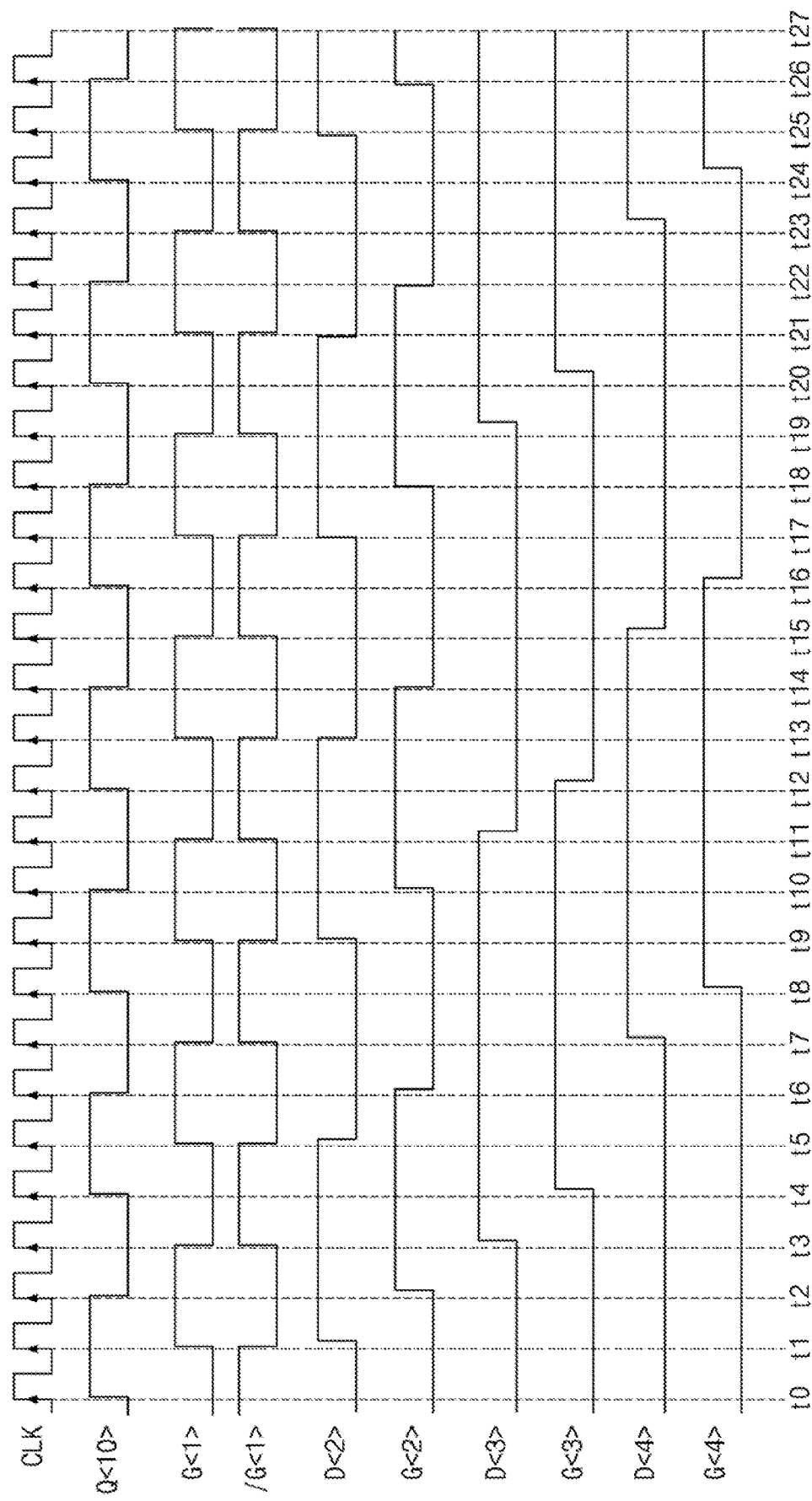

FIGS. 9A and 9B are diagrams illustrating flip-flops generating the gray code signals G<2>, G<3>, and G<4> in a gray counter and an operation of the flip-flops.

FIG. 9A illustrates a circuit diagram of the flip-flops FF<2> to FF<4> and FF<6> to FF<9> generating the gray code signal G<2>, G<3>, and G<4>. FIG. 9B illustrates waveforms of the gray code signals G<2>, G<3>, and G<4> generated by the flip-flops FF<2> to FF<4> and FF<6> to FF<9> of FIG. 8A.

Referring to FIGS. 9A and 9B, the two flip-flops FF<2> and FF<6> generate the gray code signal G<2> using the gray code signal G<1>. An inverted gray code signal /G<1> output from the flip-flop FF<1> is provided to the clock input terminal of the flip-flop FF<6>. An inverted output terminal /Q of the flip-flop FF<6> is connected with a data input terminal "D" of the flip-flop FF<6> for the purpose of feeding back an output of the flip-flop FF<6>. The flip-flop FF<6> divides the inverted gray code signal /G<1> by 2 and outputs the second input data D<2>. When the second input data D<2> is provided to the flip-flop FF<2>, the flip-flop FF<2> delays the second input data D<2> as much as one period of the clock signal CLK and outputs the gray code signal G<2>.

The gray code signal G<2> of a previous bit is used to generate the gray code signal G<3>. The flip-flops FF<3>, FF<7>, and FF<8> are used to generate the gray code signal G<3>. An inverted version of the gray code signal G<2> output from the flip-flop FF<2> is provided to a clock input terminal of the flip-flop FF<7>. An inverted output terminal /Q of the flip-flop FF<7> is connected with a data input terminal "D" of the flip-flop FF<6> for the purpose of feeding back an output of the flip-flop FF<7>. Accordingly, the flip-flop FF<7> divides and outputs the inverted gray code signal /G<2> by 2. In this case, output data of the flip-flop FF<7> is delayed by the flip-flop FF<8> and FF<3> as much as two periods (2CLK) of the clock signal CLK. Thus, the third input data D<3> has a waveform that is obtained by delaying the inverted version of the gray code signal G<2> as much as one period of the clock signal CLK. The gray code signal G<3> is generated through an additional delay of the flip-flop FF<3>, which corresponds to one period of the clock signal CLK.

The flip-flops FF<4>, FF<9>, and FF<10> are used to generate the gray code signal G<4>. The gray code signal G<3> and the data signal Q<10> provided from the Johnson counter 143 are used by the flip-flops FF<4>, FF<9>, and FF<10> to generate the gray code signal G<4>. An inverted version of the gray code signal G<3> output from the flip-flop FF<3> is provided to the data input terminal "D" of the flip-flop FF<9>, and an output of the flip-flop FF<10> is provided to the clock input terminal of the flip-flop FF<9>. In this case, the flip-flop FF<9> may output the fourth input data D<4> in synchronization with the data signal Q<10>.

The flip-flop FF<4> delays the fourth input data D<4> as much as one period of the clock signal CLK and outputs the gray code signal G<4>.

As described above, each of the gray code signals G<2>, G<3>, and G<4> may be generated by dividing a gray code signal of a lower bit by two and adding a delay.

Figure 10:
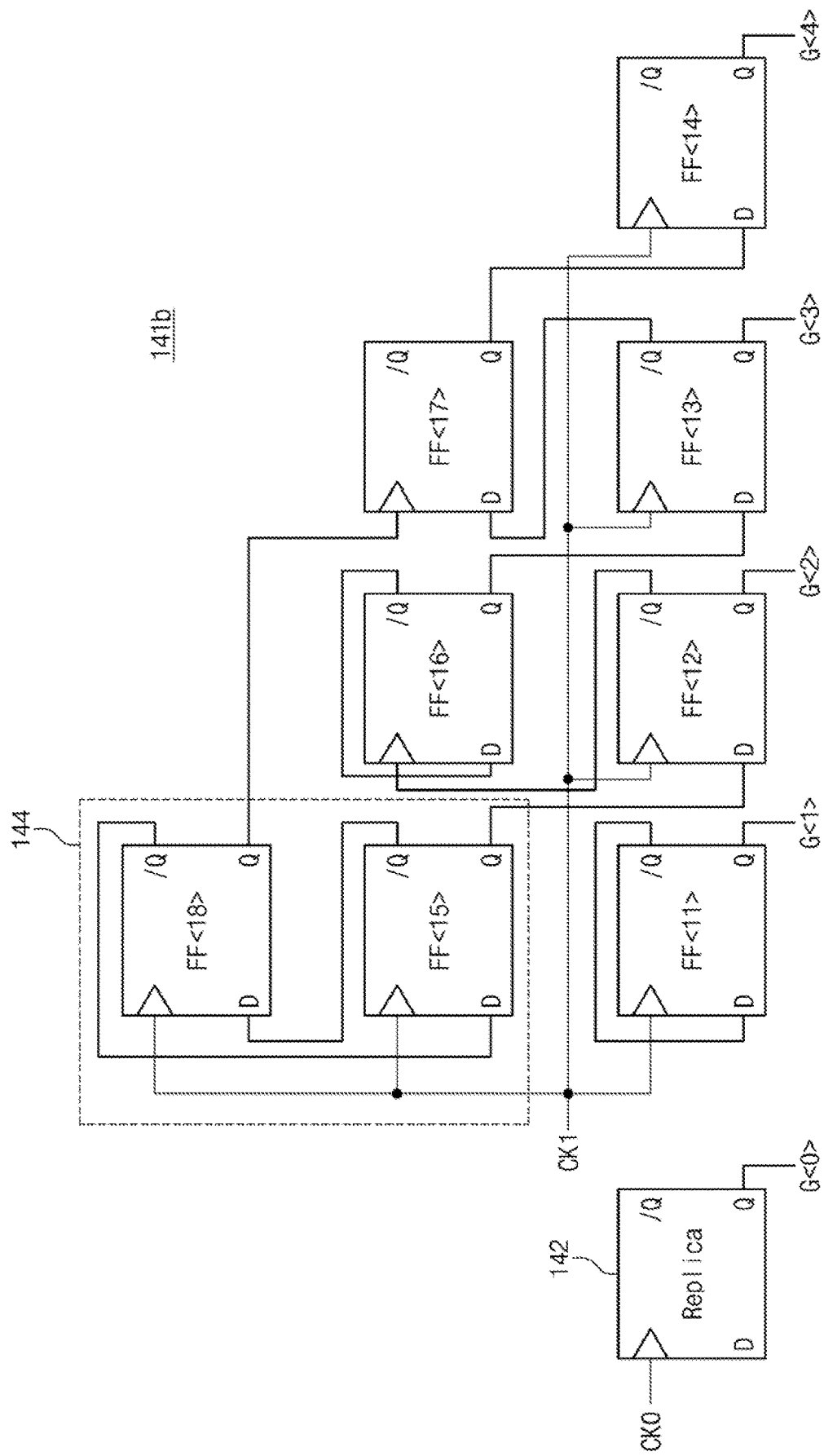
FIG. 10 is a diagram illustrating a gray counter according to another example embodiment.

FIG. 10 is a diagram illustrating a gray counter according to another example embodiment.

Referring to FIG. 10, unlike the gray counter 141a, a gray counter 141b generates the LSB gray code signal G<0> by using a replica circuit 142. The gray code signals G<1> to G<4> may be generated by using the remaining eight flip-flops FF<11> to FF<18>. Here, a first clock signal CK0 is a clock signal that is obtained by dividing the clock signal CLK of FIG. 5 by 2. A second clock signal CK1 is a signal that is obtained by delaying the first clock signal CK0 as much as half a period of the clock signal CLK.

First, the replica circuit 142 is used to generate the gray code signal G<0> corresponding to the least significant bit. The replica circuit 142 provides a delay corresponding to a delay "Tc-q" of each of the flip-flops FF<11> to FF<14>. Accordingly, the gray code signal G<0> is generated as a signal that is obtained by dividing the clock signal CLK by 2.

The gray code signal G<1> may be generated by the flip-flop FF<11>. The second clock signal CK1 is input to a clock input terminal of the flip-flop FF<11>. An inverted output terminal /Q of the flip-flop FF<11> is connected with a data input terminal "D" of the flip-flop FF<11> for the purpose of feeding back an output of the flip-flop FF<11>. In this case, the flip-flop FF<11> may divide the second clock signal CK1 by 2 and may output the gray code signal G<1>.

The flip-flops FF<12>, FF<15>, and FF<18> are used to generate the gray code signal G<2>. Each of the flip-flops FF<12>, FF<15>, and FF<18> is triggered in synchronization with the second clock signal CK1. The second clock signal CK1 is a signal that has the same period as the first clock signal CK0 and is delayed with respect to the clock signal CLK as much as half a period of the clock signal CLK. The two flip-flops FF<15> and FF<18> may constitute a Johnson counter 144 and may divide the second clock signal CK1 by 4. An output of the Johnson counter 144 may be delayed by the flip-flop FF<12> as much as one period of the second clock signal CK1 and may be output as the gray code signal G<2>.

The gray code signal G<3> may be generated by dividing the gray code signal G<2> corresponding to a previous bit by 2 and delaying the divided result as much as one period of the second clock signal CK1. To this end, an inverted gray code signal /G<2> is provided to a clock input terminal of the flip-flop FF<16>. A data input terminal "D" and an inverted data output terminal /Q of the flip-flop FF<16> may be connected to operate as a T-flip-flop. Accordingly, the flip-flop FF<16> may divide and output the inverted gray code signal /G<2> by 2. In this case, an output of the flip-flop FF<16> may be delayed by the flip-flop FF<13> as much as one period of the second clock signal CK1 and may be output as the gray code signal G<3>.

The gray code signal G<3> of a previous bit is used to generate the gray code signal G<4>. The flip-flops FF<14>, FF<17>, and FF<18> are used to generate the gray code signal G<4>. An inverted gray code signal /G<3> output from the flip-flop FF<13> is provided to a data input terminal "D" of the flip-flop FF<17>, and an output of the flip-flop FF<18> is provided to a clock input terminal of the flip-flop FF<17>. The flip-flop FF<14> delays an output of the flip-flop FF<17> as much as one period of the second clock signal CK1 and outputs the MSB gray code signal G<4>.

As described above, the gray counter 141b according to the present example embodiment uses one replica circuit 142 and eight flip-flops FF<11> to FF<18>, which may provide a slight improvement of the differential non-linearity (DNL) is slight while improving an operating speed. Thus, when speed is relatively important, the LSB gray code signal G<0> operating at a high frequency may be applied in the gray counter 141b by using the replica circuit 142.

Figure 11:
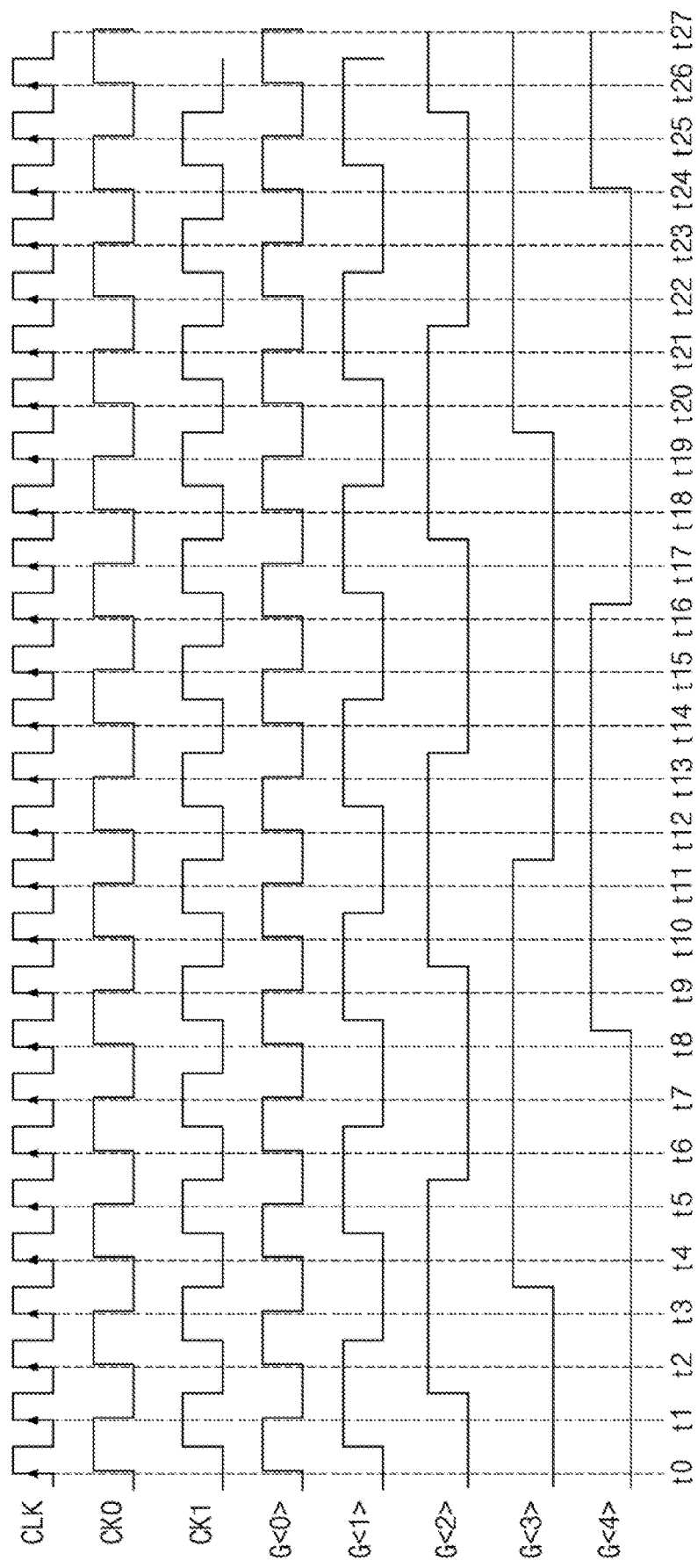
FIG. 11 is a timing diagram schematically illustrating a characteristic of a gray counter of FIG. 10.

FIG. 11 is a timing diagram schematically illustrating a characteristic of a gray counter of FIG. 10.

Referring to FIG. 11, the gray counter 141b of FIG. 10 generates the LSB gray code signal G<0> by using the replica circuit 142. The gray code signals G<1> to G<4> may be generated by using eight flip-flops FF<11> to FF<18>. The replica circuit 142 operates in synchronization with the first clock signal CK0, and the flip-flops FF<11> to FF<18> are triggered in synchronization with the second clock signal CK1. The first clock signal CK0 is a signal that is obtained by dividing the clock signal CLK by 2, and the second clock signal CK1 is a signal that is obtained by delaying the first clock signal CK0 as much as half a period of the clock signal CLK.

First, the LSB gray code signal G<0> is generated by the replica circuit 142 that delays the first clock signal CK0 as much as a given delay "Tc-q". The first clock signal CK0 is a clock signal that is obtained by dividing the clock signal CLK by 2. Accordingly, the gray code signal G<0> is generated by delaying and outputting a signal, which is obtained by dividing the clock signal CLK by two, as much as a given delay of the replica circuit 142.

The gray code signal G<1> is generated from the flip-flop FF<11> that divides and outputs the second clock signal CK1 by 2. In consideration of a delay relationship between the first clock signal CK0 and the second clock signal CK1, the gray code signal G<1> is generated as a signal that is obtained by dividing the gray code signal G<0> by 2 and delaying and outputting the divided result as much as one period of the clock signal CLK.

The gray code signal G<2> is generated by the flip-flops FF<12>, FF<15>, and FF<18> that are triggered in synchronization with the second clock signal CK1. The Johnson counter 144 composed of the two flip-flops FF<15> and FF<18> divides the second clock signal CK1 by 2 and provides the divided clock signal to the flip-flop FF<12>. Also, the flip-flop FF<12> delays the signal, which is obtained by dividing the clock signal CLK by two, as much as one period of the second clock signal CK1 and outputs the gray code signal G<2>.

Each of the gray code signal G<3> and the gray code signal G<4> are generated in the way to divide a previous gray code signal by 2 in synchronization with the second clock signal CK1, and adjust and output a delay of the divided result.

Figure 12:
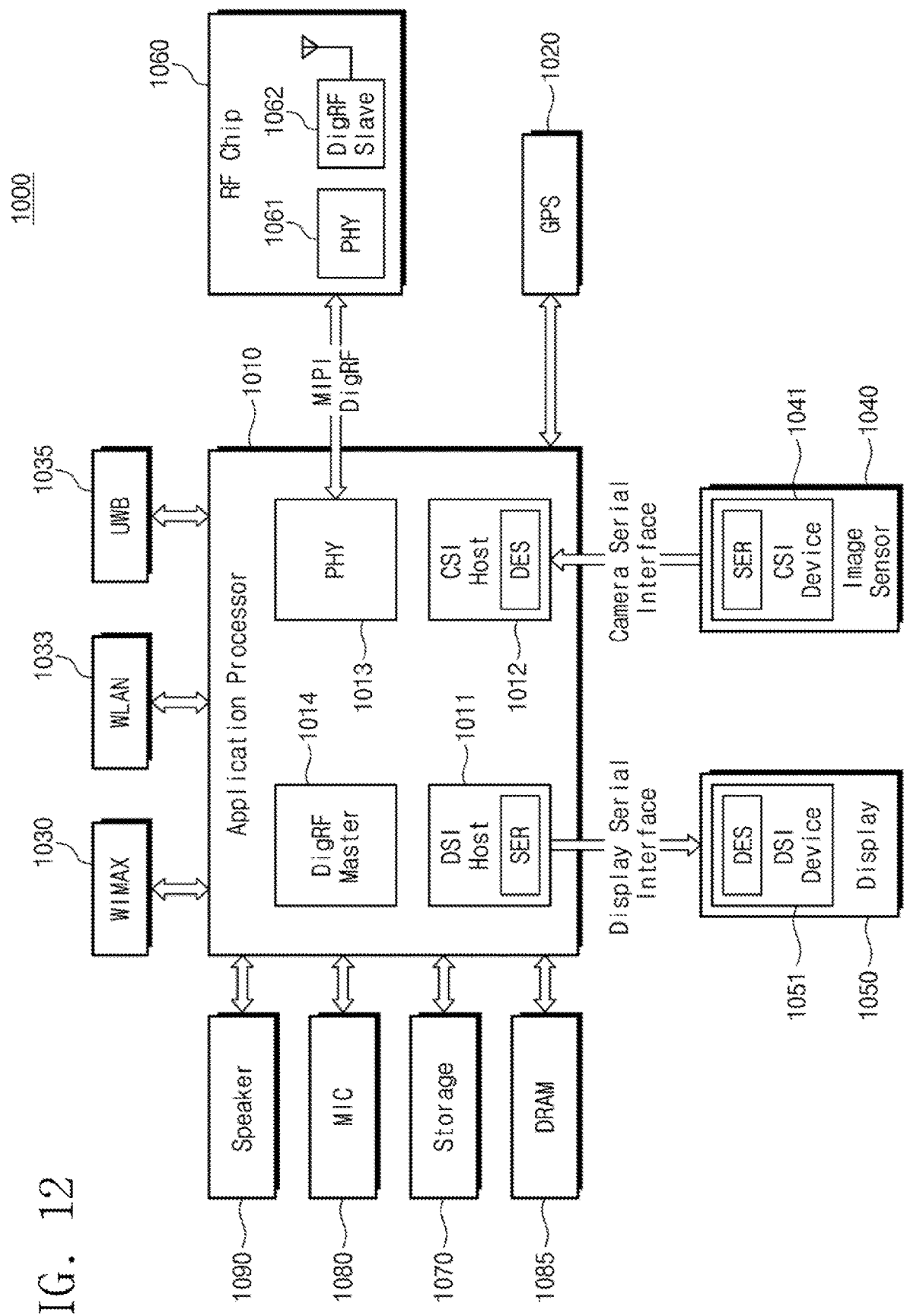
FIG. 12 is a block diagram illustrating an electronic system including an image sensor according to an example embodiment.

FIG. 12 is a block diagram illustrating an electronic system including an image sensor according to an example embodiment.

Referring to FIG. 12, an electronic system 1000 may be implemented with a data processing device that uses or supports a mobile industry processor interface (MIPI), such as a mobile phone, a portable digital assistant (PDA), a personal media player (PMP), or a smartphone. The electronic system 1000 may include an application processor 1010, an image sensor 1040, and a display 1050.

A camera serial interface (CSI) host 1012 implemented in the application processor 1010 may perform serial communication with a CSI device 1041 of the image sensor 1040 through a camera serial interface (CSI). In this case, an optical deserializer DES may be implemented in the CSI host 1012, and an optical serializer SER may be implemented in the CSI device 1041. In addition, the application processor 1010 may include an image signal processor (ISP) that performs auto white balancing.

A display serial interface (DSI) host 1011 implemented in the application processor 1010 may perform serial communication with a DSI device 1051 of the display 1050 through display serial interface (DSI). An optical serializer SER may be implemented in the DSI host 1011, and an optical deserializer DES may be implemented in the DSI device 1051.

The electronic system 1000 may further include a radio frequency (RF) chip 1060 capable of communicating with the application processor 1010. In the electronic system 1000, a physical layer (PHY) 1013 of the application processor 1010 and a PHY 1061 of the RF chip 1060 may exchange data in compliance with an MIPI DigRF interface.

The electronic system 1000 may further include a global positioning system (GPS) 1020, storage 1070, a microphone 1080, a dynamic random access memory (DRAM) 1085, and a speaker 1090, and the electronic system 1000 may communicate with an external device by using WIMAX 1030, WLAN 1033, UWB 1035, etc.

By way of summation and review, an image sensor may be implemented as a device that obtains an image by using a characteristic of a semiconductor reacting to an incident light. An analog-to-digital converter (ADC) may be used to convert an analog signal output from a pixel array of the image sensor into a digital signal. The ADC may be implemented using a counter that performs a counting operation based on a clock signal.

The counter may be implemented in various manners, but a hybrid counter in which a ripple counter and a gray counter are combined may be used to provide high speed and low power. To improve the performance of the image sensor, the number of pixels per unit area may be increased and an operating frequency may be increased.

According to an example embodiment, a gray counter capable of avoiding a delay and a differential non-linearity (DNL) may be implemented. Accordingly, a high-speed image sensor may be implemented by using the gray counter.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
a pixel sensor configured to sense an incident light and to output an analog sampling signal;
a sampler configured to compare the sampling signal and a ramp signal, and to output a comparison signal of time-axis length information; and
a gray counter configured to count a length of the comparison signal in synchronization with a clock signal, and to output a digital value, the gray counter including:
a first flip-flop configured to divide the clock signal by 2, and to generate a first gray code signal;
a second flip-flop configured to delay a first data signal, which is a four-divided signal of the clock signal, and to output a second gray code signal; and
a third flip-flop configured to delay the second gray code signal, which is two-divided, and to output a third gray code signal.

2. The image sensor as claimed in claim 1, wherein the first flip-flop is triggered at a falling edge of the clock signal.

3. The image sensor as claimed in claim 1, wherein the second flip-flop and the third flip-flop are triggered at a rising edge of the clock signal.

4. The image sensor as claimed in claim 1, further comprising a Johnson counter implemented with a flip-flop, and configured to divide the clock signal by 4 and to generate the first data signal.

5. The image sensor as claimed in claim 4, wherein the Johnson counter includes:
a fourth flip-flop triggered in response to the clock signal; and
a fifth flip-flop configured to receive data from an inverted data output terminal of the fourth flip-flop, and to output the first data signal to the second flip-flop in response to the clock signal, an inverted data output terminal of the fifth flip-flop being connected with a data input terminal of the fourth flip-flop.

6. The image sensor as claimed in claim 1, wherein the gray counter further includes a sixth flip-flop configured to divide an inverted version of the second gray code signal by 2, and to provide a result of the division to the third flip-flop.

7. The image sensor as claimed in claim 1, wherein the gray counter further includes:
a seventh flip-flop configured to divide and output an inverted version of the third gray code signal by 2;
an eighth flip-flop configured to delay and output an output of the seventh flip-flop as much as one period of the clock signal; and
a ninth flip-flop configured to delay an output of the eighth flip-flop as much as one period of the clock signal, and to output a fourth gray code signal.

8. The image sensor as claimed in claim 7, wherein the gray counter further includes:
a tenth flip-flop configured to output an inverted version of the fourth gray code signal in synchronization with the clock signal that is four-divided; and
an eleventh flip-flop configured to delay and output an output of the tenth flip-flop as much as one period of the clock signal.

9. The image sensor as claimed in claim 1, wherein a replica flip-flop circuit is configured as the first flip-flop for providing a signal delay corresponding to the second and third flip-flops.

10. A gray counter that generates a gray code count value in synchronization with a clock signal, the gray counter comprising:
a first flip-flop configured to divide the clock signal by 2, and to generate a first gray code signal corresponding to a least significant bit gray count value;

a Johnson counter configured to divide the clock signal by 4, and to output a first data signal;

a second flip-flop configured to delay the first data signal as much as a length corresponding to one period of the clock signal, and to output a second gray code signal;

a third flip-flop configured to divide the second gray code signal by 2, and to output a third gray code signal; and a plurality of flip-flops configured to generate a count value above the third gray code signal using the clock signal and the third gray code signal.

11. The gray counter as claimed in claim 10, wherein:
the first flip-flop is a D-flip-flop that is triggered at a falling edge of the clock signal, and
the D-flip-flop is implemented with a toggle flip-flop in which an inverted output terminal and a data input terminal are connected.

12. The gray counter as claimed in claim 10, wherein each of the second flip-flop and the third flip-flop is a D-flip-flop that is triggered at a rising edge of the clock signal.

13. The gray counter as claimed in claim 10, wherein the Johnson counter includes:
a fourth flip-flop triggered in response to the clock signal; and
a fifth flip-flop configured to receive data from an inverted data output terminal of the fourth flip-flop, and to output the first data signal to the second flip-flop in response to the clock signal, an inverted data output terminal of the fifth flip-flop being connected with a data input terminal of the fourth flip-flop.

14. The gray counter as claimed in claim 10, further comprising a sixth flip-flop configured to divide an inverted version of the second gray code signal by 2, and to provide a result of the division to the third flip-flop.

15. The gray counter as claimed in claim 10, wherein the gray code count value corresponds to a 5-bit value, and
wherein the plurality of flip-flops include:
a seventh flip-flop configured to divide and output an inverted version of the third gray code signal by 2;
an eighth flip-flop configured to delay and output an output of the seventh flip-flop as much as one period of the clock signal; and
a ninth flip-flop configured to delay an output of the eighth flip-flop as much as one period of the clock signal, and to output a fourth gray code signal;

a tenth flip-flop configured to output an inverted version of the fourth gray code signal in synchronization with the clock signal that is four-divided; and an eleventh flip-flop configured to delay and output an output of the tenth flip-flop as much as one period of the clock signal.

16. The gray counter as claimed in claim 15, wherein the four-divided clock signal input to the tenth flip-flop is provided using the Johnson counter.

17. A gray counter that generates a gray code count value in synchronization with a clock signal, the gray counter comprising:
a replica circuit configured to generate a first gray code signal corresponding to a least significant bit gray count value from a first clock signal, which is obtained by dividing the clock signal by 2;
a first flip-flop configured to delay a second clock signal, which is obtained by delaying the first clock signal as much as half a period of the clock signal, and to output a second gray code signal;
a Johnson counter triggered at the second clock signal, and configured to divide and output the second clock signal by 2;
a second flip-flop configured to delay an output of the Johnson counter as much as one period of the second clock signal, and to output a third gray code signal;
a third flip-flop configured to divide the third gray code signal by 2, and to output a fourth gray code signal; and
a plurality of flip-flops configured to generate a count value above the fourth gray code signal using the fourth gray code signal.

18. The gray counter as claimed in claim 17, wherein the replica circuit delays the first clock signal as much as a clock to data delay of the first flip-flop or the second flip-flop.

19. The gray counter as claimed in claim 17, wherein the first clock signal transitions at a rising edge of the clock signal, and the second clock signal transitions at a falling edge of the clock signal.

20. The gray counter as claimed in claim 17, wherein the gray counter is a 5-bit counter that uses the first gray code signal as a least significant bit.

* * * * *